(12) United States Patent
Chen (10) Patent No.: US 10,700,100 B2
(45) Date of Patent: Jun. 30, 2020

(54) DISPLAY PANEL, ARRAY SUBSTRATE AND METHOD OF FORMING THE SAME

(71) Applicant: Wuhan China Star Optoelectronics Technology Co., Ltd., Wuhan (CN)

(72) Inventor: Chen Chen, Shenzhen (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 27 days.

(21) Appl. No.: 15/740,228

(22) PCT Filed: Oct. 20, 2017

(86) PCT No.: PCT/CN2017/107151
§ 371 (c)(1),
(2) Date: Aug. 23, 2018

(87) PCT Pub. No.: WO2019/024259
PCT Pub. Date: Feb. 7, 2019

(65) Prior Publication Data
US 2019/0386037 A1    Dec. 19, 2019

(30) Foreign Application Priority Data
Jul. 31, 2017   (CN) .......................... 2017 1 0646087

(51) Int. Cl.
*G02F 1/1368* (2006.01)
*H01L 27/12* (2006.01)
*G02F 1/1362* (2006.01)

(52) U.S. Cl.
CPC ........ *H01L 27/1237* (2013.01); *G02F 1/1368* (2013.01); *G02F 1/136286* (2013.01); *H01L 27/1225* (2013.01)

(58) Field of Classification Search
CPC ..................................................... G02F 1/1368
See application file for complete search history.

(56) References Cited

U.S. PATENT DOCUMENTS

| | | | |
|---|---|---|---|
| 6,028,650 A | 2/2000 | Kuroha et al. | |
| 2008/0017862 A1* | 1/2008 | Lee | G02F 1/136286 257/59 |

(Continued)

FOREIGN PATENT DOCUMENTS

| | | |
|---|---|---|
| CN | 1287287 A | 3/2001 |
| CN | 1691353 A | 11/2005 |

(Continued)

OTHER PUBLICATIONS

Xiang, Dai Ya, "Drive and design of TFT LCD panel," First edition, Nov. 30, 2008, pp. 57-58 and 80-81.

*Primary Examiner* — Sang V Nguyen
(74) *Attorney, Agent, or Firm* — Brinks Gilson & Lione (57) ABSTRACT

A display panel, an array substrate and a method of forming the same are disclosed. The array substrate includes a plurality of pixel regions, each of the pixel regions includes a pixel electrode and at least one oxide film transistor. An input terminal of the pixel electrode is connected with an output terminal of the oxide film transistor, a control terminal of the oxide film transistor is connected with a scan line, an end of the scan line is connected with a drive circuit, and the oxide film transistor further includes a gate insulation layer disposed on a gate thereof. A thickness of the gate insulation layer is inversely proportional to a length of the scan line, which is connected with the corresponding gate, from a connection point with the drive circuit to a connection point with the gate.

3 Claims, 6 Drawing Sheets

(56) References Cited

U.S. PATENT DOCUMENTS

| | | | |
|---|---|---|---|
| 2009/0027604 A1* | 1/2009 | Guo | H01L 27/124 349/138 |
| 2010/0289034 A1* | 11/2010 | Nakai | H01L 27/14625 257/84 |
| 2012/0287092 A1 | 11/2012 | Tatara et al. | |
| 2012/0308936 A1* | 12/2012 | Cho | G03F 1/00 430/319 |
| 2012/0329240 A1 | 12/2012 | Fujii et al. | |
| 2013/0271444 A1 | 10/2013 | Wang et al. | |
| 2014/0235022 A1 | 8/2014 | Ema et al. | |
| 2014/0362317 A1* | 12/2014 | Kubota | G02F 1/13394 349/39 |
| 2015/0263029 A1* | 9/2015 | Kim | H01L 27/11575 257/314 |
| 2017/0194401 A1* | 7/2017 | Cho | H01L 27/3262 |
| 2017/0213883 A1* | 7/2017 | Zhang | H01L 27/1255 |
| 2018/0182779 A1* | 6/2018 | Song | H01L 29/417 |

FOREIGN PATENT DOCUMENTS

| | | |
|---|---|---|
| CN | 1971910 A | 5/2007 |
| CN | 101004527 A | 7/2007 |
| CN | 101090095 A | 12/2007 |
| CN | 101140396 A | 3/2008 |
| CN | 104102058 A | 10/2014 |
| CN | 105372894 A | 3/2016 |
| CN | 105514118 A | 4/2016 |

\* cited by examiner

DISPLAY PANEL, ARRAY SUBSTRATE AND METHOD OF FORMING THE SAME

CROSS-REFERENCE TO RELATED APPLICATIONS

The present application is a 35 U.S.C. § 371 National Phase conversion of International (PCT) Patent Application No. PCT/CN2017/107151 filed Oct. 20, 2017, which claims foreign priority to Chinese Patent Application No. 201710646087.3, filed on Jul. 31, 2017 in the State Intellectual Property Office of China, the entire contents of which are hereby incorporated by reference.

FIELD OF THE INVENTION

The present disclosure generally relates to the technical field of displaying, and more particularly, to a display panel, an array substrate and a method of forming the same.

BACKGROUND OF THE INVENTION

Thin film transistor-liquid crystal displays (which are called TFT-LCDs for short) are mainstream display devices currently, and a display area thereof consists of numerous pixel regions on an array substrate.

During an operation of the TFT-LCD, a specific voltage is applied to a gate of the TFT via a scan line so as to control the TFT to be turned on or turned off. The scan line is generally a metal layer, so it has a certain resistance. As the signal transmission distance increases, the signal in the scan line weakens gradually, and this phenomenon is called voltage drop. The voltage drop effect increases gradually as the distance between a sub-pixel and a drive input terminal of the scan line increases gradually. As a result, the input voltage to the gate of the TFT that is closer to the input terminal of the scan line is larger than the input voltage to the gate of the TFT that is farther away from the input terminal of the scan line. Therefore, the picture that is closer to the input terminal of the scan line is brighter than the picture that is farther away from the input terminal of the scan line. That influences the uniformity of the displaying of the display panel.

SUMMARY OF THE INVENTION

A primary technical problem to be solved by the present disclosure is to provide a display panel, an array substrate and a method of forming the same, which improve the uniformity of the display panel and improve the quality of the display panel.

To solve the aforesaid technical problem, a first technical solution adopted by the present disclosure is to provide an array substrate. The array substrate includes a plurality of pixel regions, each of the pixel regions includes a pixel electrode and at least one oxide film transistor. An input terminal of the pixel electrode is connected with an output terminal of the oxide film transistor. A control terminal of the oxide film transistor is connected with a scan line, an end of the scan line is connected with a drive circuit. The oxide film transistor further includes a gate insulation layer disposed on a gate thereof, and a thickness of the gate insulation layer is inversely proportional to a length of the scan line, which is connected with the corresponding gate, from a connection point with the drive circuit to a connection point with the gate.

To solve the aforesaid technical problem, a second technical solution adopted by the present disclosure is to provide a display panel. The display panel includes an array substrate and further includes color filter substrates disposed opposite to the array substrate and a liquid crystal layer disposed between the color filter substrate and the array substrate. The array substrate includes a plurality of pixel regions, each of the pixel regions includes a pixel electrode and at least one oxide film transistor. An input terminal of the pixel electrode is connected with an output terminal of the oxide film transistor. A control terminal of the oxide film transistor is connected with a scan line, an end of the scan line is connected with a drive circuit. The oxide film transistor further includes a gate insulation layer disposed on a gate thereof, and a thickness of the gate insulation layer is inversely proportional to a length of the scan line, which is connected with the corresponding gate, from a connection point with the drive circuit to a connection point with the gate.

To solve the aforesaid technical problem, a third technical solution adopted by the present disclosure is to provide a forming method of an array substrate. The forming method includes: forming a gate on a substrate; forming a gate insulation layer on the gate, wherein a thickness of the gate insulation layer is inversely proportional to a length of a scan line, which is connected with the corresponding gate, from a connection point of the scan line with a drive circuit to a connection point with the gate.

Benefits of the present disclosure are as follows: the thickness of the gate insulation layer of the oxide film transistor included in the array substrate of the present disclosure is inversely proportional to a length of the scan line, which is connected with the corresponding gate, from a connection point of the scan line with the drive circuit to a connection point of the scan line with the gate; the thickness of the gate insulation layer of the oxide film transistor is inversely proportional to the value of a parasitic capacitance $C_{gs}$, thereby reducing the voltage drop effect, improving the uniformity of the display panel, and improving the quality of the display panel.

DETAILED DESCRIPTION OF THE INVENTION

The present disclosure provides a display panel, an array substrate and a method of forming the same. To make objectives, technical solutions and technical effects of the present disclosure more specific and clear, the present disclosure will be further described in detail. It shall be appreciated that, specific embodiments described herein are only for purpose of explaining the present disclosure instead of limiting the present disclosure.

This embodiment provides an array substrate, the array substrate may include a plurality of pixel regions, and each of the pixel regions may include a pixel electrode and at least one oxide film transistor. The array substrate further includes a plurality of data lines parallel with each other, and an input terminal of the oxide film transistor may be connected with a corresponding one of the data lines to input a display signal to the pixel electrode. An input terminal of the pixel electrode may be connected with an output terminal of the oxide film transistor. A control terminal of the oxide film transistor may be connected with a scan line, and an end of the scan line is connected with a drive circuit.

The aforesaid drive circuit is a circuit capable of providing a specific voltage, and it inputs a specific voltage to the control terminal of the oxide film transistor via the scan line so as to control the oxide film transistor to be turned on or turned off.

In one embodiment, the oxide film transistor is a bottom-gate type structure. The oxide film transistor includes a gate and further includes a gate insulation layer disposed on the gate, an oxide film layer that covers the gate insulation layer and a source and a drain disposed on the oxide film layer, and the source and the drain are separated from each other by a trench. Moreover, the source, the drain, and portions of the oxide film layer that are not covered by the source and the drain are further covered by a passivation layer.

Optionally, in another embodiment, the oxide film transistor may also be a top-gate type structure. That is, the oxide film transistor may include a source and a drain, a gate insulation layer disposed on the source and the drain, and a gate disposed on the gate insulation layer. The type of the oxide film transistor may be designed depending on actual situations, and no specific limitation is made thereto.

It shall be appreciated that, no matter the oxide film transistor is the top-gate type structure or the bottom-gate type structure, the thickness of the gate insulation layer is inversely proportional to a length of the scan line, which is connected with the corresponding gate, from a connection point of the scan line with the drive circuit to a connection point of the scan line with the gate.

Additionally, the number of the oxide film transistors in each pixel region may be 2 or 3 and may be designed depending on actual situations, and no specific limitation is made thereto.

Figure 1:
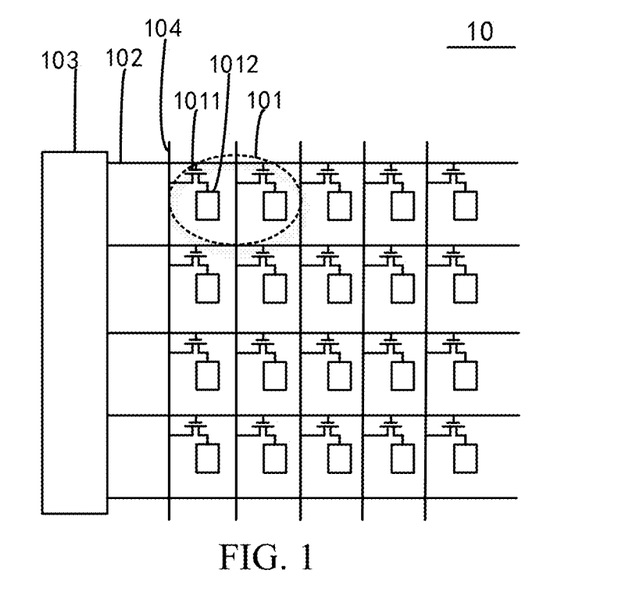
FIG. 1 is a schematic structural view of an embodiment of an array substrate according to the present disclosure.

In order to clearly illustrate the structure of the aforesaid array substrate, reference is made to FIG. 1, which is a schematic structural view of an embodiment of an array substrate according to the present disclosure.

In this embodiment, the array substrate 10 includes a plurality of parallel scan lines 102 and a plurality of parallel data lines 104. The total number of the scan lines 102 and the data lines 104 may be designed depending on actual situations and no specific limitation is made thereto. The scan lines 102 and the data lines 104 cross each other but do not intersect with each other to form a plurality of pixel regions 101, wherein each of the pixel regions 101 includes an oxide film transistor 1011 and a pixel electrode 1012. An output terminal of the oxide film transistor 1011 is connected with an input terminal of the pixel electrode 1012, a control terminal of the oxide film transistor 1011 is connected with a scan line 102, and an end of the scan line 102 is connected with a drive circuit 103.

The oxide film transistor 1011 includes a gate and a gate insulation layer, and a thickness of the gate insulation layer is inversely proportional to a length of the scan line 102, which is connected with the corresponding gate, from a connection point of the scan line 102 with the drive circuit 103 to a connection point of the scan line 102 with the gate of the corresponding oxide film transistor 1011.

Figure 2:
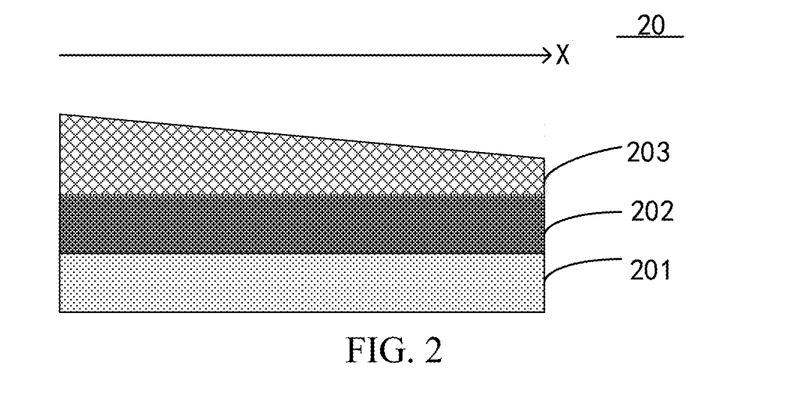
FIG. 2 is a schematic structural view of an embodiment of an oxide film transistor in the array substrate of FIG. 1.

Specifically, in order to illustrate that the thickness of the gate insulation layer of the oxide film transistor 1011 in the array substrate 10 is inversely proportional to a length of the scan line 102, which is connected with the gate, measured from a connection point with the drive circuit 103 to a connection point with the gate of the oxide film transistor 1011, reference is made to FIG. 2. FIG. 2 provides a schematic structural view of an embodiment of the oxide film transistor included in the array substrate of FIG. 1.

Referring to FIG. 2, the oxide film transistor in the array substrate 20 includes a substrate 201, other film layer 202 of the oxide film transistor that is disposed on the substrate 201, and a gate insulation layer 203 that is disposed on other film layer 202 of the oxide film transistor. The direction indicated by an arrow X in FIG. 2 is the extending direction of the scan line of the array substrate 20, i.e., the direction from the connection point of the scan line with the drive circuit to the connection point of the scan line with the gate of the corresponding oxide film transistor. Along the direction indicated by the arrow X, the length of the scan line from the connection point of the scan line with the gate of the corresponding oxide film transistor to the connection point of the scan line with the drive circuit increases gradually, and the thickness of the gate insulation layer 203 of the corresponding oxide film transistor decreases gradually, i.e., the length is inversely proportional to the thickness.

Here it shall be emphasized that, the oxide film transistor shown in FIG. 2 is a schematic view illustrating the overall structure of one kind of the oxide film transistors in the array substrate for representation, and thicknesses of gate insulation layers of different oxide film transistors connected to the same scan line are different in this embodiment.

Figure 3:
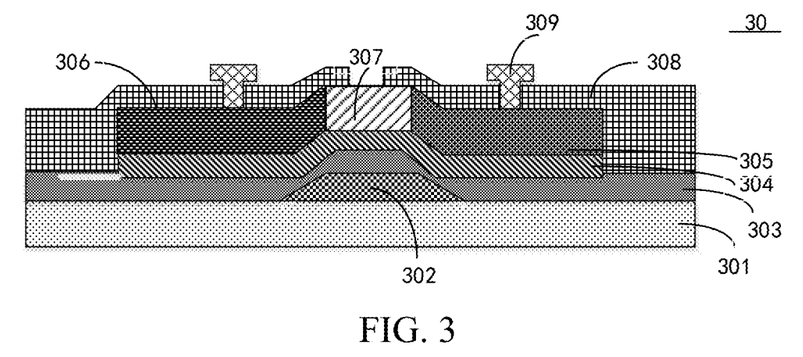
FIG. 3 is a schematic structural view of another embodiment of the oxide film transistor in the array substrate of FIG. 1.

In order to clearly illustrate the structure of the oxide film transistor of the aforesaid embodiments, the oxide film transistor having a bottom-gate type structure is taken as an example for illustration. Referring to FIG. 3, FIG. 3 is a schematic structural view of another embodiment of the oxide film transistor included in the array substrate of FIG. 1.

In this embodiment, the oxide film transistor 30 includes a substrate 301, a gate 302, a gate insulation layer 303 disposed on the gate 302, an oxide film layer 304 covering the gate insulation layer 303, a source 305 and a drain 306 disposed on the oxide film layer 304 and separated from each other by a trench 307. The oxide film transistor 30 also includes a passivation layer 308 covering the source 305, the drain 306, and portions of the oxide film layer 304 that are not covered by the source 305 and the drain 306, and a contact electrode 309 disposed on the passivation layer 308.

In one embodiment, the array substrate includes an oxide film transistor 30, the array substrate further includes a scan line and a drive circuit, an end of the scan line is connected with the drive circuit, and the other end of the scan line is connected with gates 302 at control terminals of several oxide film transistors 30. The thickness of the gate insulation layers 303 of the oxide film transistors 30 connected to the same scan line is inversely proportional to a length of the scan line, which is connected with the corresponding gate 302, from a connection point of the scan line with the drive circuit to a connection point of the scan line with the corresponding gate 302.

Further speaking, the gate insulation layer 303 may be formed by using a photomask whose light transmission amount increases gradually according to a preset condition along an extending direction of the scan line. Specifically, the gate insulation layer 303 may be formed by covering the gate insulation layer 303 with a photoresist layer, defining the pattern of the gate insulation layer 303 through a mask whose light transmission amount increases gradually according to a preset condition, and then etching the photoresist layer. In another embodiment, the gate insulation layer 303 may also be formed by using an incident light whose light intensity increases gradually along an extending direction of the scan line.

Here it shall be emphasized that, the oxide film transistor 30 shown in FIG. 3 is a schematic view illustrating the specific structure of a single oxide film transistor 30, and is configured to explain the structure among specific film layers of the oxide film transistor 30 in this embodiment.

In actual situations, the oxide film transistor has a parasitic capacitance $C_{gs}$ due to process limitations when manufacturing the array substrate, and the value of the parasitic capacitance $C_{gs}$ is relevant to the thickness of the gate insulation layer of the oxide film transistor. During the use of the display device, the display device has a problem of non-uniform brightness due to the parasitic capacitance $C_{gs}$.

In the aforesaid embodiment, the thickness of the gate insulation layer of the oxide film transistor in the array substrate is non-uniform so that the parasitic capacitance $C_{gs}$ of the oxide film transistor is different, thereby improving the uniformity of the displaying.

Figure 4:
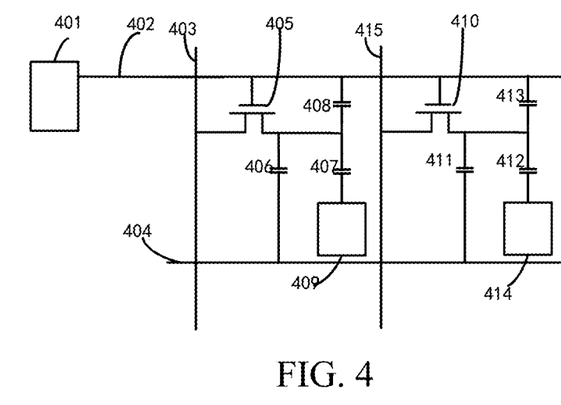
FIG. 4 is a schematic circuit diagram of an embodiment of pixel regions in the array substrate of FIG. 1.

In order to explain in detail the working principle of improving the uniformity of the displaying through designing the thickness of the gate insulation layer, reference is made to FIG. 4, which is a schematic circuit diagram of an embodiment of pixel regions included in the array substrate of FIG. 1.

As shown in FIG. 4, in this embodiment, the pixel region includes an oxide film transistor 405 and an oxide film transistor 410, corresponding gates of the oxide film transistor 405 and the oxide film transistor 410 are connected to an end of a same scan line 402, and the other end of the scan line 402 is connected to a drive circuit 401.

A drain of the oxide film transistor 405 is connected with a data line 403, a source of the oxide film transistor 405 is connected with an end of a storage capacitance $C_{st}$ 406 and a pixel capacitance $C_{IC}$ 407. Another end of the storage capacitance $C_{st}$ 406 is connected with a common electrode end 404, and another end of the pixel capacitance $C_{IC}$ 407 is connected with a pixel electrode 409. Meanwhile, there is a parasitic capacitance $C_{gs}$ 408 between the gate of the oxide film transistor 405 and the source and the drain of the oxide film transistor 405.

A drain of the oxide film transistor 410 is connected with a data line 415, a source of the oxide film transistor 410 is connected with an end of a storage capacitance $C_{st}$ 411 and a pixel capacitance $C_{IC}$ 412. Another end of the storage capacitance $C_{st}$ 411 is connected with the common electrode end 404, and another end of the pixel capacitance $C_{IC}$ 412 is connected with a pixel electrode 414. Meanwhile, there is a parasitic capacitance $C_{gs}$ 413 between the gate of the oxide film transistor 410 and the source and the drain of the oxide film transistor 410.

It shall be appreciated that, since the length from the connection point of the scan line 402 with the gate of the oxide film transistor 410 to the connection point of the scan line 402 with the drive circuit 401 is larger than the length from the connection point of the scan line 402 with the gate of the oxide film transistor 405 to the connection point of the scan line 402 with the drive circuit 401, the thickness of the gate insulation layer of the oxide film transistor 410 formed in the aforesaid embodiment is smaller than the thickness of the gate insulation layer of the oxide film transistor 405 formed in the aforesaid embodiment. Therefore, the value of the parasitic capacitance $C_{gs}$ 413 is greater than that of the parasitic capacitance $C_{gs}$ 408.

During the operation of the array substrate, a specific voltage $V_{gh1}$ is applied to gates corresponding to the oxide film transistor 405 and the oxide film transistor 410 via the scan line 402 so as to control the oxide film transistor 405 and the oxide film transistor 410 to be turned on or turned off. The scan line 402 is generally a metal layer, so it has a certain resistance. As a signal transmission distance increases, the signal in the scan line 402 weakens gradually, and this phenomenon is called voltage drop. The theoretical calculation equation of the corresponding voltage drop is:

$$\Delta V_p = \frac{C_{gs}}{C_{gs} + C_{lc} + C_{st}} * V_{gh1} \qquad \text{(Equation 1)}$$

The value of the parasitic capacitance $C_{gs}$ 413 is greater than that of the parasitic capacitance $C_{gs}$ 408, the value of the storage capacitance $C_{st}$ 406 is equal to that of the storage capacitance $C_{st}$ 411, and the value of the pixel capacitance $C_{IC}$ 407 is equal to that of the pixel capacitance $C_{IC}$ 412. Therefore, it can be learnt according to the calculating method of the voltage drop effect shown in $$\Delta V_p = \frac{C_{gs}}{C_{gs} + C_{lc} + C_{st}} * V_{gh1}$$

(Equation 1), the voltage transmitted to the gate of the oxide film transistor 405 is equal to the voltage transmitted to the gate of the oxide film transistor 410 when the value of the parasitic capacitance $C_{gs}$ 413 is greater than that of the parasitic capacitance $C_{gs}$ 408 in a corresponding proportion, thereby improving the uniformity of the displaying. The corresponding proportion needs to be designed depending on specific situations, and no specific limitation is made thereto.

As compared to the prior art, the thickness of the gate insulation layer of the oxide film transistor included in the array substrate of this embodiment is inversely proportional to a length of the scan line, which is connected with the corresponding gate, from a connection point with the drive circuit to a connection point with the gate, and the thickness of the gate insulation layer of the oxide film transistor is inversely proportional to the value of the parasitic capacitance $C_{gs}$, thereby reducing the voltage drop effect, improving the uniformity of the display panel, and improving the quality of the display panel.

Figure 5:
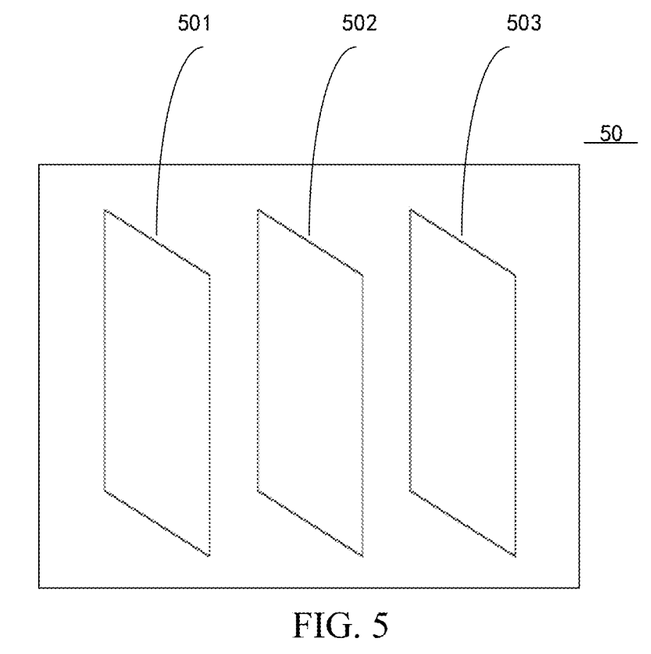
FIG. 5 is a schematic structural view of an embodiment of a display panel according to the present disclosure.

In another embodiment, referring to FIG. 5, which is a schematic structural view of an embodiment of a display panel according to the present disclosure. The display panel 50 includes any array substrate 502 described in the present disclosure, and further includes a color filter substrate 501 and a color filter substrate 503 disposed opposite to the array substrate 502 and a liquid crystal layer disposed between the color filter substrate and the array substrate.

The structure of the array substrate 502 has been detailed in the above descriptions and thus will not be further described herein.

As compared to the prior art, the thickness of the gate insulation layer of the oxide film transistor included in the array substrate of this embodiment is inversely proportional to a length of the scan line, which is connected with the corresponding gate, from a connection point with the drive circuit to a connection point with the gate, and the thickness of the gate insulation layer of the oxide film transistor is inversely proportional to the value of the parasitic capacitance $C_{gs}$, thereby reducing the voltage drop effect, improving the uniformity of the display panel, and improving the quality of the display panel.

Figure 6:
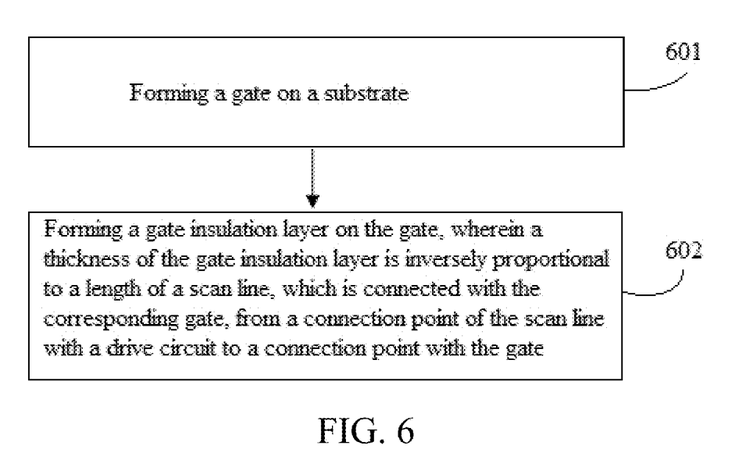
FIG. 6 is a schematic flowchart diagram of an embodiment of a method for forming an array substrate according to the present disclosure.

In another embodiment, reference is made to FIG. 6, which is a schematic flowchart diagram of an embodiment of a method for forming an array substrate according to the present disclosure.

601: forming a gate on a substrate.

In this embodiment, the gate is formed on the substrate through photomask development or etching.

602: forming a gate insulation layer on the gate, wherein a thickness of the gate insulation layer is inversely proportional to a length of a scan line, which is connected with the corresponding gate, from a connection point of the scan line with a drive circuit to a connection point with the gate.

Figure 7:
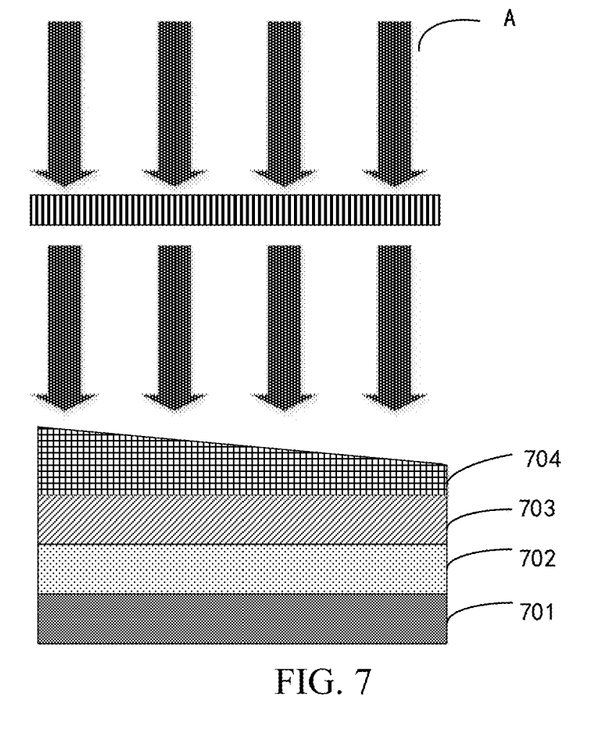
FIG. 7 is a schematic structural view of an embodiment of the method for forming an array substrate shown in FIG. 6.

In one embodiment, reference is made to FIG. 7, which is a schematic structural view of an embodiment of the method for forming an array substrate shown in FIG. 6.

As shown in FIG. 7, a gate 702 is formed on a substrate 701, the gate 702 is covered with a thin film 703, the thin film 703 is covered with a photoresist layer 704, and a thickness of the photoresist layer 704 is inversely proportional to the length from the connection point with the drive circuit to the connection point with the gate. The photoresist layer 704 is masked using an incident light A with the same light intensity. Then the photoresist layer 704 is etched to form the gate insulation layer whose thickness is inversely proportional to the length of the scan line, which is connected with the corresponding gate, from the connection point with the drive circuit to the connection point with the gate.

Figure 8:
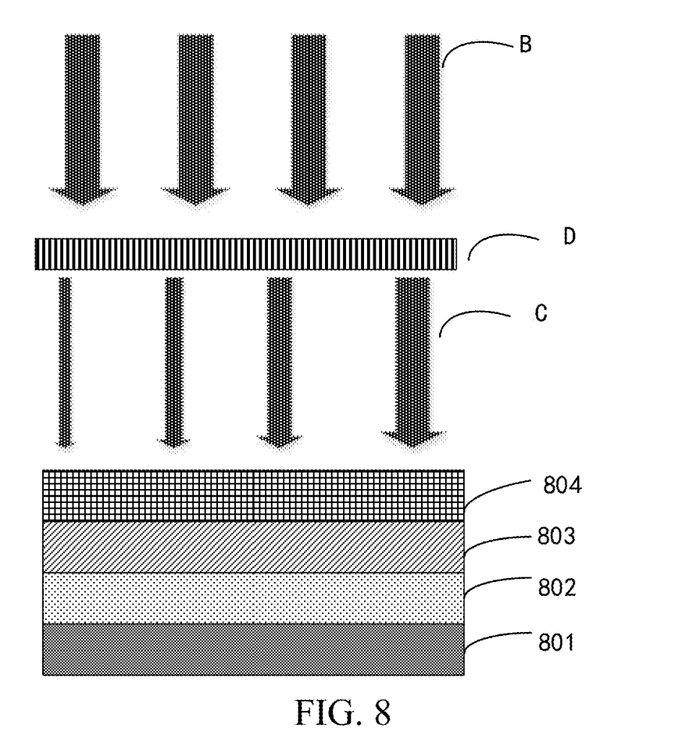
FIG. 8 is a schematic structural view of another embodiment of the method for forming an array substrate shown in FIG. 6.

In another embodiment, reference is made to FIG. 8, which is a schematic structural view of another embodiment of the method for forming an array substrate shown in FIG. 6.

As shown in FIG. 8, a gate 802 is formed on a substrate 801, the gate 802 is covered with a thin film 803, the thin film 803 is covered with a photoresist layer 804, the thickness of the photoresist layer 804 is uniform, and a gate insulation layer is formed by masking the gate insulation layer with a photomask D whose light transmission amount increases gradually according to a preset condition along an extending direction of the scan line. As shown in FIG. 8, the incident light B has the same light intensity, and the light intensity of the incident light C penetrating through the photomask D increases gradually along the direction of the scan line. The thickness of the gate insulation layer formed in this embodiment is inversely proportional to the length of the scan line, which is connected with the corresponding gate, from the connection point with the drive circuit to the connection point with the gate.

Figure 9:
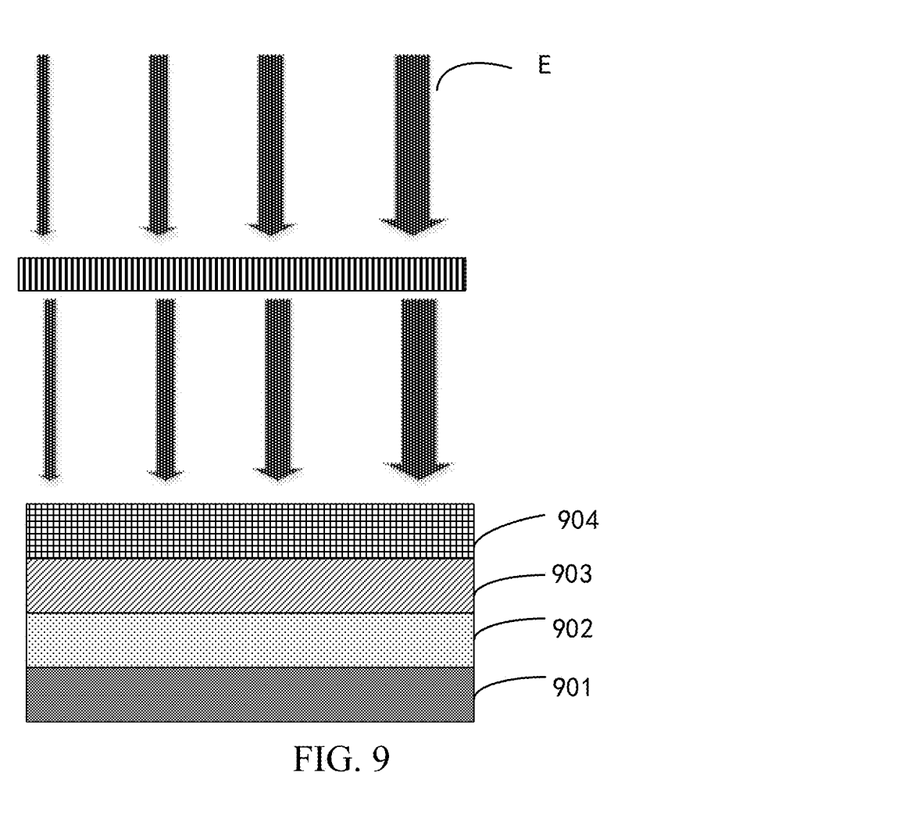
FIG. 9 is a schematic structural view of yet another embodiment of the method for forming an array substrate shown in FIG. 6.

Optionally, in another embodiment, reference is made to FIG. 9, which is a schematic structural view of yet another embodiment of the method for forming an array substrate shown in FIG. 6.

As shown in FIG. 9, a gate 902 is formed on a substrate 901, the gate 902 is covered with a thin film 903, the thin film 903 is covered with a photoresist layer 904, the thickness of the photoresist layer 904 is uniform, the photoresist layer 904 is masked by using the incident light E whose light intensity is non-uniform and increases gradually along the direction of the scan line. The thickness of the gate insulation layer formed in this embodiment is inversely proportional to the length of the scan line, which is connected with the corresponding gate, from the connection point with the drive circuit to the connection point with the gate.

It shall be appreciated that, any of the above embodiments may be combined with each other to form the gate insulation layer that is equivalent to any of the above embodiments, and this will not be further described herein.

Further speaking, in an embodiment, an array substrate may also be formed using the forming method described in any of the above embodiments when the thin film transistor included in the array substrate is the top-gate type structure.

As compared to the prior art, the thickness of the gate insulation layer of the oxide film transistor included in the array substrate that is formed using the method of forming an array substrate in any of the above embodiments is inversely proportional to a length of the scan line, which is connected with the corresponding gate, from a connection point with the drive circuit to a connection point with the gate. And the thickness of the gate insulation layer of the oxide film transistor is inversely proportional to the value of the parasitic capacitance $C_{gs}$, thereby reducing the voltage drop effect, improving the uniformity of the display panel, and improving the quality of the display panel.

What described above are only the embodiments of the present disclosure, but are not intended to limit the scope of the present disclosure. Any equivalent structures or equivalent process flow modifications that are made according to the specification and the attached drawings of the present disclosure, or any direct or indirect applications of the present disclosure in other related technical fields shall all be covered within the scope of the present disclosure.

What is claimed is:

1. A forming method of an array substrate comprising:
   providing a substrate;
   forming a gate on the substrate; and
   forming a gate insulation layer on the gate, wherein a thickness of the gate insulation layer is inversely proportional to a length of a scan line, which is connected to the corresponding gate, from a first connection point with a drive circuit to a second connection point with the gate,
   wherein, the forming of the gate insulation layer comprises:
   covering the gate insulation layer with a photoresist layer, wherein a thickness of the photoresist layer is inversely proportional to the length from the first connection point to the second connection point; and
   etching the photoresist layer to form the gate insulation layer whose thickness is inversely proportional to the length of the scan line, which is connected to the corresponding gate, from the first connection point to the second connection point.

2. The forming method of claim 1, wherein the forming of the gate insulation layer further comprises:
- forming the gate insulation layer by a photomask whose light transmission amount increases gradually according to a preset condition along an extending direction of the scan line from the drive circuit.

3. The forming method of claim 1, wherein the forming of the gate insulation layer further comprises:
- projecting an incident light on the photoresist layer, wherein the incident light intensity increases gradually according to a preset condition along an extending direction of the scan line from the drive circuit.

* * * * *